United States Patent
Leijten-Nowak et al.

(10) Patent No.: US 7,355,443 B2
(45) Date of Patent: Apr. 8, 2008

(54) INTEGRATED CIRCUIT HAVING BUILDING BLOCKS

(76) Inventors: Katarzyna Leijten-Nowak, Prof. Holstlaan 6, 5656 AA Eindhoven (NL); Atul Katoch, Prof. Holstlaan 6, 5656 AA Eindhoven (NL)

(*) Notice: Subject to any disclaimer, the term of this patent is extended or adjusted under 35 U.S.C. 154(b) by 567 days.

(21) Appl. No.: 10/519,767

(22) PCT Filed: Jun. 17, 2003

(86) PCT No.: PCT/IB03/02743
§ 371 (c)(1),
(2), (4) Date: Dec. 28, 2004

(87) PCT Pub. No.: WO2004/004008
PCT Pub. Date: Jan. 8, 2004

(65) Prior Publication Data
US 2005/0257947 A1    Nov. 24, 2005

(30) Foreign Application Priority Data
Jun. 28, 2002  (EP)  .................................. 02077571

(51) Int. Cl.
*H01L 25/00* (2006.01)
*H03K 19/177* (2006.01)
(52) U.S. Cl. .............................. 326/41; 326/39; 326/47
(58) Field of Classification Search .................. 326/39, 326/41, 47
See application file for complete search history.

(56) References Cited

U.S. PATENT DOCUMENTS

| | | | | |
|---|---|---|---|---|
| 5,327,023 A | * | 7/1994 | Kawana et al. | 326/39 |
| 5,396,126 A | * | 3/1995 | Britton et al. | 326/41 |
| 6,191,611 B1 | * | 2/2001 | Altaf | 326/39 |

FOREIGN PATENT DOCUMENTS

| | | |
|---|---|---|
| GB | 2 280 293 | 1/1995 |
| WO | WO 98 55918 | 12/1998 |

* cited by examiner

Primary Examiner—Anh Q. Tran
(74) Attorney, Agent, or Firm—Peter Zawilski

(57) ABSTRACT

An integrated circuit (300) has a regular grid formed by substantially identical building blocks (100a-i). To avoid possible routing conflicts around the edges of the integrated circuit (300), which can be introduced by the use of a single type of an asymmetric building block, the integrated circuit (300) is extended with routing cells (200) that provide routing at the edges of the grid that are uncovered by the routing networks of the building blocks (100a-i). The routing cells (200) and the switch cell (250) are combined with a first routing structure (330) and a second routing structure (340) to form a routing network (280) surrounding the grid of the integrated circuit (300). Consequently, an integrated circuit (300) is presented that comprises only a single type of building block (100a-i) but still has a fully symmetric routing architecture.

9 Claims, 3 Drawing Sheets

INTEGRATED CIRCUIT HAVING BUILDING BLOCKS

The invention relates to an integrated circuit comprising a plurality of substantially identical interconnected building blocks laid out in a regular grid, each building block comprising a logic cell; first routing means coupled to the logic cell for data communication between the logic cell and a first further logic cell on the grid in a first direction; second routing means coupled to the logic cell for data communication between the logic cell and a second further logic cell on the grid in a second direction; and switch means for coupling the first routing means to the second routing means.

In the field of semiconductors, a lot of effort is put into the creation of versatile integrated circuits. Because of the development cost of integrated circuits (ICs) and electronic devices carrying such circuits, it is desirable to have integrated circuits that are capable of performing a large number of tasks, in order to reuse the available hardware as much as possible. A possible realization of this objective is by means of reconfigurable ICs, e.g. field-programmable gate arrays (FPGAs). Such circuits typically comprise a number of building blocks, which include a programmable logic unit capable of executing a number of tasks and programmable routing hardware for providing an interconnection or routing network between the building blocks. Typically, the building blocks are arranged in a regular pattern, i.e. a grid, in order to keep the interconnections between the various building blocks short, which contributes to a good performance of the IC. It is important that the routing network is as complete as possible, e.g. that the data paths between the building blocks are kept as short as possible, because this reduces the impact of inter-building block data communication on the performance of the IC.

A complication in the design of such ICs is that, although the overall symmetry of the grid is high, the symmetry of the building blocks itself is typically low. For instance, the building block will have routing means on one edge for routing data from and to the logic cell in a first direction and will have further routing means on a second edge of the building block for routing data from and to the logic cell in a second direction. This implies that the other edges of the building blocks lack routing hardware, which creates routing problems at the edges of the grid that are formed by edges of building blocks lacking routing resources, especially if those building blocks require off-grid data communication. In some cases, this will mean that some tasks cannot be mapped on the IC, because the routing infrastructure required for that particular task is unavailable. Although the problem can be solved by extending the building blocks with routing hardware on all its edges, this solution is considered undesirable because it drastically increases the already substantial silicon real estate, which adds to both the complexity and the cost of the IC.

U.S. Pat. No. 6,002,268 provides a solution for this problem by disclosing an FPGA that has been extended with a padframe surrounding the grid of the FPGA. The padframe has the dedicated task of providing routing interconnections between the building blocks of the grid and I/O cells outside the grid. This is a disadvantage, because the padframe increases the silicon real estate while offering only limited functionality. It is pointed out that one of the main bottlenecks in the design of reconfigurable logic devices is the significantly smaller area effectiveness in comparison to dedicated devices, which emphasizes the need for area efficient solutions to the aforementioned routing issues.

Inter alia, it is an object of the present invention to provide an integrated circuit according to the opening paragraph having more versatile routing functionality around the grid.

The invention is described by the independent claims. The dependent claims define advantageous embodiments.

The invention is based on the realization that integrated circuits having a repetitive structure can be designed by combining building blocks to form the desired IC. The main design effort is the design of the building block that has to be capable of executing a number of desired tasks. This includes the design of the logic unit as well as the design of the first and second routing means. After this has been realized, the grid is built up in a straightforward fashion by combining the building blocks in a tile-like fashion. Consequently, the combined first routing means of the building blocks forming a first edge of the grid as well as the combined second routing means of the building blocks forming a second edge of the grid already combine into a partial routing network surrounding the grid. The routing network is completed by the application of routing cells, e.g. routing tiles, to the edges of the grid that are not covered by the partial routing network formed by the combined first and second routing means. This has the advantage that this routing network can be easily formed by combining routing hardware that is already present with the dedicated routing tiles, which yields a routing network that can be used for both intra-grid and off-grid communication. A switch cell, which has the function of coupling one part of the routing network to another part of the routing network, completes the routing network. This switch cell, which preferably is a separate tile, but which can also be integrated in one of the routing cells or in a building block of the grid, typically couples a subset of the plurality of routing cells to one of the first and second subsets of the plurality of building blocks.

It is emphasized that although the inclusion of additional routing and switch cells increases the number of building blocks that have to be designed, this is not a disadvantage, because the routing cells and switch cells are of relatively low complexity. Therefore, they can be designed rapidly, and since their availability reduces the design effort required for the development of the building blocks, the overall design effort does not necessarily increase. In addition, because a single type building block for the grid can be used, the scalability of the IC is enhanced, which is an important advantage in terms of design reuse.

It is an advantage if each routing cell from the plurality of routing cells is arranged to connect at least a neighboring logic cell in the grid to off-grid hardware. Although the routing cells can be used to upgrade the on-grid routing facilities, the routing cells are preferably used to improve the routing between the building blocks in the grid and off-grid hardware. This improves the flexibility of the IC and allows for the mapping of a wider range of tasks on the IC. It is pointed out that one routing cell can be used to provide routing to more than one building block; i.e. several building blocks can share a routing cell.

It is another advantage if the integrated circuit further comprises a plurality of interconnect cells being arranged to connect the building blocks from the first subset and the second subset to off-grid hardware.

Even though the interconnection hardware for connecting the building blocks forming the first and second subsets to off-grid hardware can be included in these building blocks, it is preferred to provide this interconnection hardware by means of separate interconnect cells, e.g. tiles that provide this interconnection hardware. This has the advantage that the building blocks forming the grid can be kept as similar as possible. Obviously, such interconnect functionality is preferred to be also present at the egdes of the grid covered by the routing cells. Additional interconnect cells can be used on those edges, although it is preferred that the interconnect functionality is integrated in the routing cells.

It is yet another advantage if the switch means comprise a plurality of programmable switches.

The inclusion of programmable switches in the switch means makes the switch means reconfigurable. Consequently, the on-grid routing between the various building blocks through their first and second routing means becomes very flexible, thus further enhancing the flexibility of the IC by allowing the mapping of a wider range of tasks on the IC.

In another embodiment of the present invention, the building blocks have a substantially rectangular shape; and the plurality of routing cells comprises: a first subset of routing cells for integrating a third subset of the plurality of building blocks into the routing network via a first side of the rectangular shape; and a second subset of routing cells for integrating a fourth subset of the plurality of building blocks into the routing network via a second side of the rectangular shape, the first side being different in length to the second side.

If the building blocks are not squares but rectangular of shape, it can be necessary to have more than one size of routing cell to avoid mapping, i.e. layout, issues. Obviously, the width of the routing cell is typically defined by the width of the building block facing the edge of the grid. With rectangularly shaped building blocks, this leads to two subsets of routing cells, with their respective widths matching the dimensions of the sides of the building blocks.

The performance demands on electronic devices, e.g. systems-on-chip, are becoming higher and higher, not only in terms of speed but also in terms of functional versatility. The inclusion of an integrated circuit according to the present invention in such devices improves the functional versatility of the electronic device, because a large number of tasks can be mapped on the IC. Consequently, the electronic device requires less dedicated hardware, which reduces the silicon real estate of the electronic device and yields a device that can be produced at a lower cost than devices lacking an IC according to the present invention.

The design method of the present invention allows for a straightforward design of ICs having a highly symmetrical grid, which reduces the design effort for such ICs, especially when the routing cells and the switch cells can be added to the grid as tiles, preferably by utilizing a graphical user interface of some description. Consequently, the time-to-market for ICs being developed by this method is reduced, which is an important advantage.

The invention is described in more detail and by way of non-limiting examples with reference to the accompanying drawings, wherein.

Figure 1:
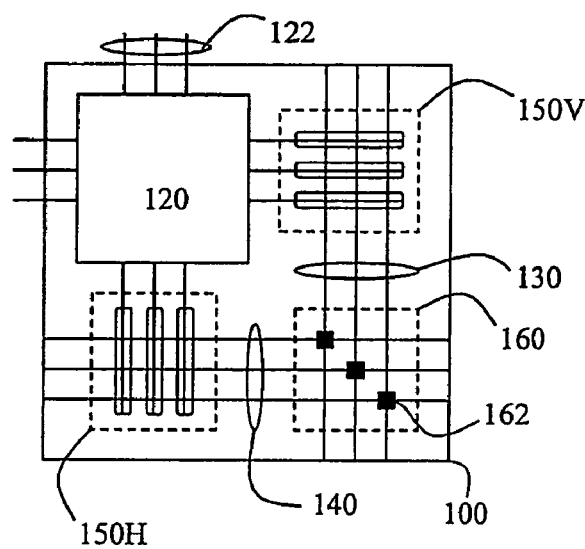
FIG. 1 depicts an exemplary building block of an IC having a grid of such building blocks.

FIG. 1 shows a building block 100 for a grid of a reconfigurable circuit, e.g. a fine-grained device like an FPGA, or a coarser grained reconfigurable circuit. Typically, building block 100 includes a logic unit 120 that is capable of performing a number of tasks, from which a task can be selected by configuring the logic unit 120. The logic unit 120 of building block 100 is coupled to a first routing network 130 through a connection box 150V to enable data communication with other building blocks in the grid in a first, e.g. vertical direction. In addition, logic unit 120 is coupled to a second routing network 140 through a connection box 150H to enable data communication with other building blocks in the grid in a second, e.g. horizontal direction. The first routing network 130 and the second routing network 140 are coupled through a plurality of programmable switches 162 in switch box 160. The use of programmable switches enables the configurable routing of the grid, i.e. the data communication interconnect of the building blocks. Building block 100 further comprises a plurality of interconnections 122 for coupling the building block to other building blocks in the grid.

It is emphasized that this architecture of building block 100 is by way of non-limiting example only. Other, well-known architectures of building blocks for regular grids are equally acceptable without departing from the teachings of the present invention. In addition, it should be understood by those skilled in the art that the routing architectures formed by routing networks 130 and 140 and switch box 160 are depicted in a highly schematic manner and by way of non-limiting example; more complex architectures can be thought of, in which unidirectional, bidirectional and buffered routing structures may be present without departing from the scope of the present invention.

Preferably, a grid of a reconfigurable circuit is built up by substantially identical building blocks like building block 100, because this requires little design effort. But, as can be seen in FIG. 1, such building blocks are typically asymmetric, because routing networks 130 and 140 only cover two sides of the building block 100. This asymmetry will be reflected in the grid being substantially asymmetrical, and will result in the lack of routing hardware on the edges of the grid that are formed by the sides of building blocks that are uncovered by a routing network. Therefore, up until now the grids of reconfigurable circuits have been built up by using a plurality of types of building blocks to ensure the presence of a complete routing network on the grid or by using a dedicated grid-surrounding routing network to avoid the routing problems on the edges of grids resulting from the use of a single type of building block 100.

Figure 2A:
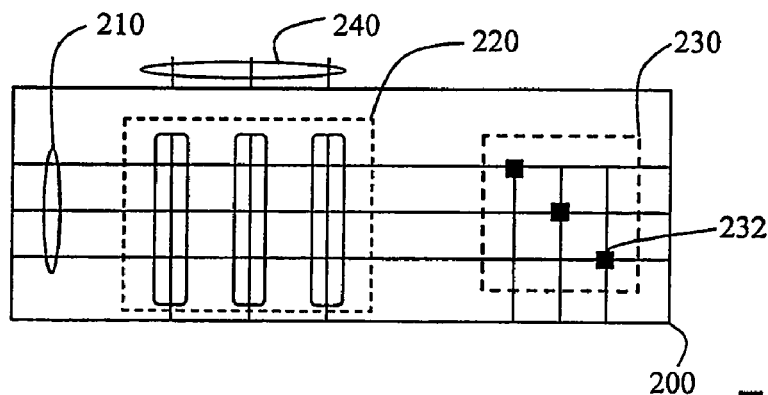
FIGS. 2a-2c depict the various types of routing cells according to the present invention.
Figure 2B:
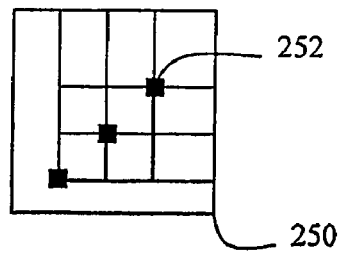
Figure 2C:
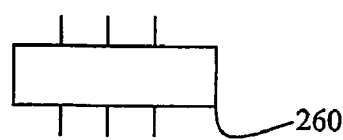

However, the use of the cells of the present invention as displayed in FIGS. 2a-2c enables the application of a single type of building block 100 without the need for a dedicated grid-surrounding network, because the use of these cells solves the routing problems on the uncovered edges of the grid. In FIG. 2a, a routing cell is depicted. The routing cell 200 includes routing wiring 210 coupled to a switch cell 230, which includes programmable switches 232. Such a switch cell 230 can also be used as an independent building block for interconnecting neighboring routing cells, although this has the disadvantage that the number of different types of building blocks increases. In addition, the routing cell 200 includes a connection box 220 for connecting a logic cell of a building block 100 to the routing cell 200. Preferably, routing cell 200 further has interconnects 240 for connecting the routing network surrounding the grid to off-grid hardware, although this functionality can also be implemented by using interconnect cells (as set out below). It is emphasized that the layout of routing cell 200 as depicted in FIG. 2a corresponds with the routing architecture of the logic cell 100 by way of example only. It will be obvious that if the routing architecture of logic cell 100 is changed, the architecture of routing cell 200 changes accordingly (as will be set out below).

In FIG. 2b, a switch cell 250 including programmable switches 252 is shown. Such a switch cell can be used to interconnect various segments of the routing network surrounding the grid. In a preferred solution, only one switch cell 250 is required to complete the routing network surrounding the grid. It is emphasized that the switch cell 250 can be integrated in a routing cell 200 without departing from the scope of the invention.

In FIG. 2c, an interconnect cell 260 is shown. Such an interconnect cell can be used to interconnect a building block 100 on the edge of the grid to off-grid hardware. The interconnect cell 260 may be integrated in a building block 100 on the edge of the grid. This will still leave the building block 100 substantially the same as the other building blocks in the grid. However, it is preferred that interconnect cell 260 is an autonomous cell, so that only a single type of building block 100 has to be designed. In addition, the interconnect cells can be present as autonomous cells on the edges of the grid covered by the routing cells 200, if these cells lack such functionality themselves.

Figure 3:
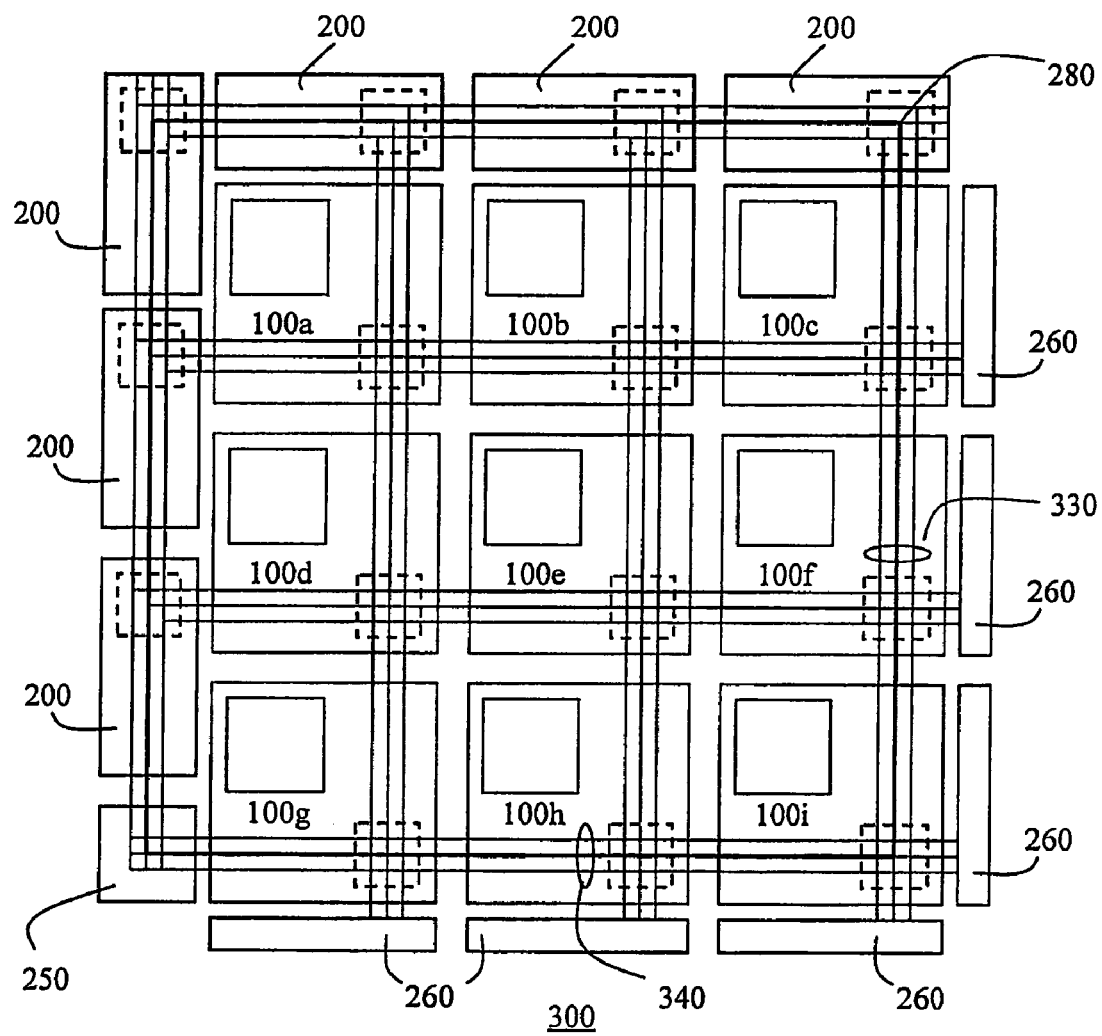
FIG. 3 shows an IC with a surrounding routing network according to the present invention.

In FIG. 3, an exemplary combination of the various elements as depicted in FIG. 2 with a grid formed by building blocks as depicted in FIG. 1 is presented. Integrated circuit 300 has a plurality of building blocks 100a-i that are organized in a regular grid. The first routing networks of the building blocks 100a,d,g, 100b,e,h and 100c,f,i form vertical routing structures on the grid via the respective switch cells of the building blocks 100a-i. The second routing networks of the building blocks 100a,b,c 100d,e,f and 100g,h,i form horizontal routing structures on the grid via the respective switch cells of the building blocks 100a-i. The asymmetric nature of the respective building blocks 100a-i are reflected in the asymmetry of the formed grid of IC 300. The grid lacks routing structures at the top and left edges of the grid.

Now, according to the present invention, the routing structures that are already present on the edges of the grid are being used to form a routing network 280 surrounding the complete grid. A first part of the routing network 280 is formed by the routing structure 330, which includes the first routing networks of a first subset of the plurality of building blocks, i.e. building blocks 100c,f,i. A second part of the routing network 280 is formed by the further routing structure 340, which includes the second routing networks of a second subset of the plurality of building blocks, i.e. building blocks 100g-i. In addition, routing cells 200 are used to provide routing means on the top and left edges of the grid by coupling the routing cells 200 to the top edges of building blocks 100a-c and the left edges of building blocks 100a,d,f. This way, the routing cells 200 also form a part of a routing network 280 surrounding the grid. The further routing structure 340 is coupled to the part of the routing network 280 formed by the routing cells 200 via switch cell 250, which completes the routing network 280. The routing network 280 is depicted by a single bold line for reasons of clarity only. The structure of IC 300 is completed by interconnect cells 260, which couple respective building blocks 100g-i and 100c,f,i to off-grid hardware, e.g. a data communication bus or other communication hardware. Consequently, a reconfigurable IC 300 is obtained with high symmetry and large routing flexibility, which advantageously implies that a large number of applications can be mapped on the grid of IC 300.

In the embodiment shown in FIG. 3, the routing cells 200 include an interconnect cell like interconnect cell 260 to provide the desired interconnectivity between the grid and external hardware. However, it is pointed out that this is not strictly necessary; routing cells 200 do not have to include such functionality, in which case interconnect cells 260 can be found on all edges of the grid. Furthermore, it is emphasized that other layouts of the routing cells 200 are possible without departing from the scope of the present invention; the routing cells 200 on the left hand side of the grid can for instance be aligned alongside a single building block, in which case switch cell 250 will be located in the top left edge of the IC 300. Obviously, terms like left, right, top and bottom should not be considered limiting, they are merely used for reasons of clarity only. In addition, the routing cells can be designed to cover more than one building block 100, for instance by including a plurality of switch cells 230 in the routing cell 200. In such designs, a routing cell 200 will typically provide routing for a number of building blocks, the number being equal to the number of switch cells 230 included.

Figure 4:
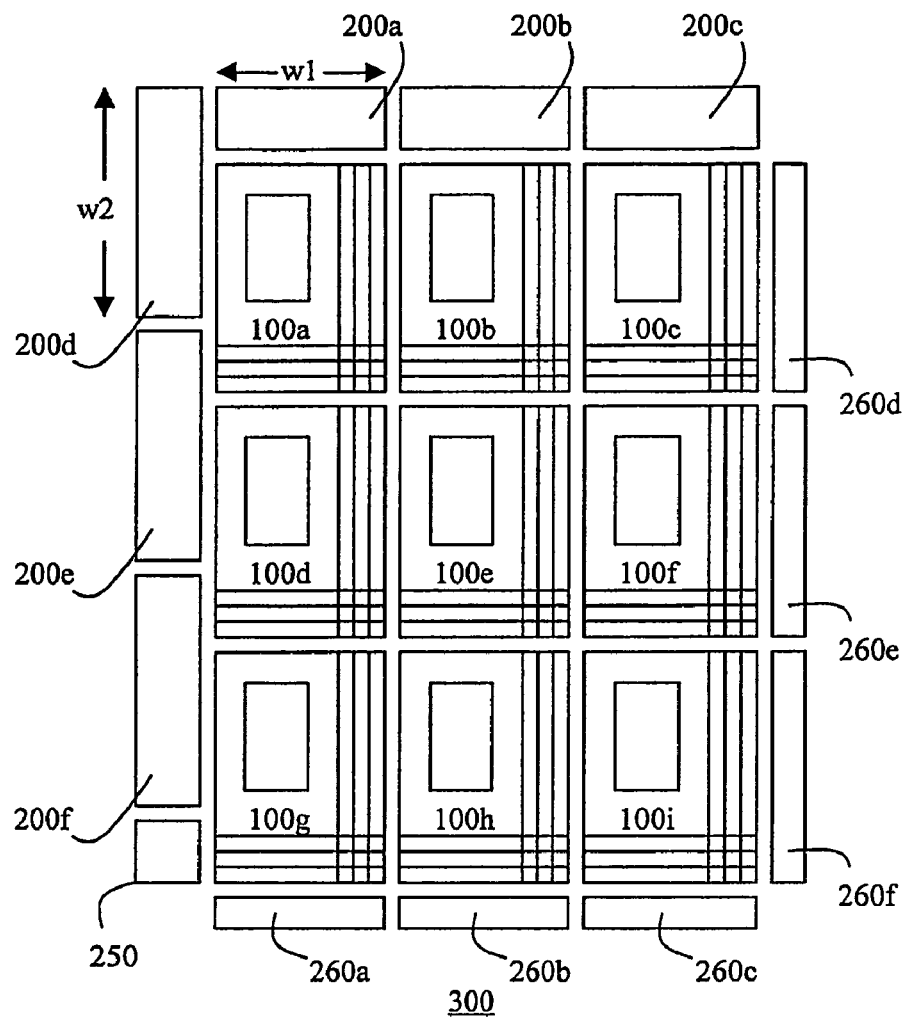
FIG. 4 shows another IC with a surrounding routing network according to the present invention.

If the building blocks 100 that form the grid of IC 300 have a rectangular shape other than a square, it is necessary to use two sizes of routing cells 200. An exemplary and schematic layout of such an IC 300 is given in FIG. 4.

A first subset of routing cells 200, i.e. routing cells 200a-c is used for integrating a third subset of the plurality of building blocks, i.e. building blocks 100a-c, into the routing network via a first side of their rectangular shape, and a second subset of routing cells 200, i.e. routing cells 200d-f is used for integrating a fourth subset of the plurality of building blocks, i.e. building blocks 100a,d,g into the routing network via a second side of their rectangular shape, the first side being different in length to the second side. Typically, the first subset of routing cells will have a length w1 corresponding with the width of a building block 100 and the second subset of routing cells 200 will have a length w2 corresponding with the length of a building block 100.

The same applies to the interconnect cells 260. A first subset of interconnect cells 260, i.e. routing cells 260a-c is used for connecting a subset of the plurality of building blocks, i.e. building blocks 100a-c, to off-grid hardware via a first side of their rectangular shape, and a second subset of interconnect cells 260, i.e. interconnect cells 260d-f is used for connecting a further subset of the plurality of building blocks, i.e. building blocks 100c,f,i to off-grid hardware via a second side of their rectangular shape.

Figure 5:
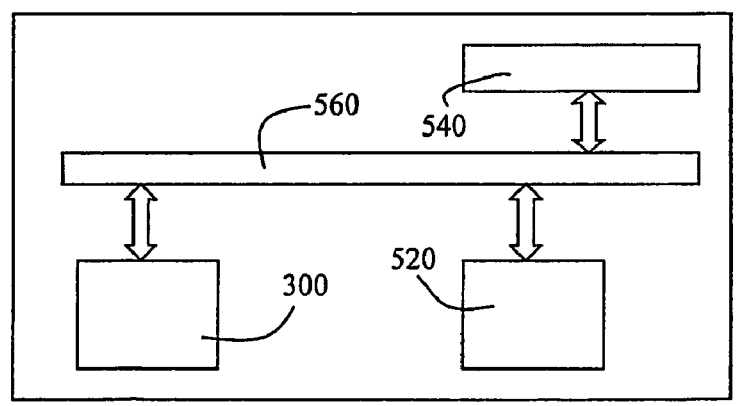
FIG. 5 depicts an electronic device having an IC according to the present invention.

FIG. 5 shows an electronic device 500 having an integrated circuit 300 according to the present invention. Integrated circuit 300 is coupled to a data communication bus 560 or another data communication architecture, as are processing element 520, which typically is arranged to perform a dedicated task, and data storage element 540, e.g. a RAM, ROM or other memory device. Electronic device 500, which can be a mobile phone, a navigation system or another device for processing digital data, benefits from the presence of an integrated circuit 300 according to the invention, because integrated circuit 300 combines a large degree of routing flexibility, which increases the number of possible tasks that such a reconfigurable circuit can perform, with a reduced price, because the design effort for such a circuit is relatively small due to the fact that only one type of building block for the grid has to be designed. Therefore, the electronic device 500 can be marketed at a competitive price while offering versatile functionality because of the large number of tasks that can be mapped on the IC 300.

The teachings of the present inventions allow for a very effective design method of integrated circuits like FPGAs and other reconfigurable circuits.

As already mentioned, the main bottleneck in the design of such circuits is the design of the building blocks that are to form the grid of the integrated circuit. To avoid routing issues that are associated with the aforementioned asymmetries that are introduced by designing a single type of cell, at least two, symmetrical complementary, type of building blocks are designed. This increases the complexity of the design process and the related time-to-market of the integrated circuit, which is a disadvantage in a market where short times-to-market are an important factor in the success of a semiconductor product.

In the method of the present invention, a first step includes the designing of a plurality of substantially identical interconnected building blocks, each building block comprising a logic cell, the building block further having first routing means coupled to the logic cell for data communication between the logic cell and a first further logic cell on the grid in a first direction and having second routing means coupled to the logic cell for data communication between the logic cell and a second further logic cell on the grid in a second direction, with the building block further comprising switch means for coupling the first routing means to the second routing means. In other words, a single type of building block is designed, which reduces the design effort required for the development of the integrated circuit. Subsequently, the plurality of building blocks is laid out in a regular grid.

To avoid the negative consequences of the routing asymmetry in the laid-out grid, the method further comprises the step of designing a routing network surrounding the grid by including a first subset of the plurality of building blocks that have their respective first routing means form a part of a routing network surrounding the grid, a second subset of the plurality of building that have their second routing means form a further part of a routing network surrounding the grid and a plurality of routing cells and a switch cell for completing the routing network surrounding the grid. The combination of routing hardware that is already present on the edges of the grid with the dedicated routing cells and the switch cell eliminates the routing asymmetry of a grid that is built up by single type building blocks. The dedicated routing cells and the switch cell are relatively simple modules that can be easily designed in a separate design step. Consequently, the method of the present invention involves the design of a single type of building block only combined with the design of a complete and symmetrical routing infrastructure of the integrated circuit.

It is emphasized that the modular character of the various elements that are combined into an integrated circuit designed with the method of the invention makes this method particularly suitable to be integrated into a computer aided design (CAD) tool for the design of the intended integrated circuits.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit comprising:
   a plurality of substantially identical interconnected building blocks laid out in a regular grid, each building block comprising:
   a logic cell;
   first routing means coupled to the logic cell for data communication between the logic cell and a first further logic cell on the grid in a first direction; and
   second routing means coupled to the logic cell for data communication between the logic cell and a second further logic cell on the grid in a second direction, and
   switch means for coupling the first routing means to the second routing means;
   characterized in that:
   a first subset of the plurality of building blocks have their respective first routing means form a part of a routing network surrounding the grid;
   a second subset of the plurality of building have their second routing means form a further part of a routing network surrounding the grid; and
   the integrated circuit further comprises a plurality of routing cells being coupled to the part and the further part of the routing network for completing the routing network surrounding the grid, and a plurality of interconnect cells that inter-couple the building blocks from the first subset and the second subset.

2. An integrated circuit as claimed in claim 1, characterized in that the plurality of routing cells comprises a switch cell for coupling a subset of the plurality of routing cells to one of the first subset and second subset of the plurality of building blocks.

3. An integrated circuit as claimed in claim 1, characterized in that each routing cell from the plurality of routing cells is arranged to connect at least a neighboring logic cell in the grid to off-grid hardware.

4. An integrated circuit as claimed in claim 1, wherein the plurality of interconnect cells are arranged to connect the building blocks from the first subset and the second subset to off-grid hardware.

5. An integrated circuit as claimed in claim 1, characterized in that the switch means comprise a plurality of programmable switches.

6. An integrated circuit as claimed in claim 1, characterized in that:
   the building blocks have a substantially rectangular shape; and
   the plurality of routing cells comprises:
   a first subset of routing cells for integrating a third subset of the plurality of building blocks into the routing network via a first side of the rectangular shape; and
   a second subset of routing cells for integrating a fourth subset of the plurality of building blocks into the routing network via a second side of the rectangular shape, the first side being different in length to the second side.

7. An electronic device, comprising:
   data communication means;
   a data storage element coupled to the data communication means for storing data;
   a processing element coupled to the data communication means for processing of data by execution of a dedicated task; and
   an integrated circuit as claimed in claim 1 for further processing of data by execution of a task from a plurality of tasks, the task being selectable by means of configuring the integrated circuit, the integrated circuit being coupled to the data communication means.

8. A method of designing an integrated circuit, comprising:

designing a plurality of substantially identical interconnected building blocks, each building block comprising:

a logic cell;

first routing means coupled to the logic cell for data communication between the logic cell and a first further logic cell on the grid in a first direction; and second routing means coupled to the logic cell for data communication between the logic cell and a second further logic cell on the grid in a second direction, and switch means for coupling the first routing means to the second routing means;

laying out the plurality of building blocks in a regular grid;

characterized in that the method further comprises the step of:

designing a routing network surrounding the grid by including:

a first subset of the plurality of building blocks that have their respective first routing means form a part of the routing network;

a second subset of the plurality of building blocks that have their second routing means form a further part of a routing network; and a plurality of routing cells coupled to the part and further part of the routing network for completing the routing network surrounding the grid, and characterized in that the method further comprises the step of designing a plurality of interconnect cells that inter-couple the building blocks from the first subset and the second subset.

9. A method as claimed in claim 8, wherein the interconnect cells are arranged to connect a plurality of building blocks on an edge of the grid with off-grid hardware.

* * * * *